(12) United States Patent
Ahn et al.

(10) Patent No.: US 11,581,210 B2
(45) Date of Patent: Feb. 14, 2023

(54) MICRO LED TRANSFER SYSTEM

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 721 days.

(21) Appl. No.: 16/529,407

(22) Filed: Aug. 1, 2019

(65) Prior Publication Data

US 2020/0043771 A1  Feb. 6, 2020

(30) Foreign Application Priority Data

Aug. 2, 2018 (KR) .......................... 10-2018-0090390

(51) Int. Cl.
*H01L 21/677* (2006.01)
*H01L 21/683* (2006.01)
*H01L 33/00* (2010.01)

(52) U.S. Cl.
CPC .... *H01L 21/67784* (2013.01); *H01L 21/6838* (2013.01); *H01L 33/0095* (2013.01)

(58) Field of Classification Search
CPC .......... H01L 21/67784; H01L 21/6838; H01L 33/0095
See application file for complete search history.

(56) References Cited

U.S. PATENT DOCUMENTS

| | | | |
|---|---|---|---|
| 6,410,942 B1 | 6/2002 | Thibeault et al. | |
| 8,349,116 B1 | 1/2013 | Bibl et al. | |
| 10,347,535 B2 | 7/2019 | Bower et al. | |
| 10,355,166 B2 | 7/2019 | Jeung et al. | |
| 10,632,726 B2 | 4/2020 | Jang et al. | |
| 10,950,583 B2 * | 3/2021 | Moon ................. | H01L 21/6835 |
| 2013/0126081 A1 | 5/2013 | Hu et al. | |
| 2013/0130440 A1 | 5/2013 | Hu et al. | |
| 2013/0210194 A1 | 8/2013 | Bibl et al. | |
| 2021/0184088 A1 | 6/2021 | Kwon et al. | |

FOREIGN PATENT DOCUMENTS

| | | |
|---|---|---|
| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B | 7/2017 |
| KR | 101757404 B1 | 7/2017 |

* cited by examiner

*Primary Examiner* — Carl J Arbes

(57) ABSTRACT

The present invention relates to provide a hot air supplying head for transferring a micro LED and a micro LED transfer system using the same, the hot air supplying head effectively transferring micro LEDs.

5 Claims, 9 Drawing Sheets

MICRO LED TRANSFER SYSTEM

CROSS REFERENCE TO RELATED APPLICATION

The present application claims priority to Korean Patent Application No. 10-2018-0090390, filed Aug. 2, 2018, the entire contents of which is incorporated herein for all purposes by this reference.

BACKGROUND OF THE INVENTION

Field of the Invention

The present invention relates to a hot air supplying head for transferring a micro LED and a micro LED transfer system using the same.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses several micrometers of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and mounting the LED chips on a display pixel electrode are required.

Particularly, with regard to the transfer of the micro LED device to a display substrate, as the LED size is reduced to several micrometers, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a target substrate (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive force of the elastic transfer head is required to be higher than that of the target substrate in the transfer process to transfer micro LEDs stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since micro LEDs are immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

Methods of transferring micro LEDs using an adhesive layer in which adhesive strength of the adhesive layer is lost when a laser or heat is applied have been proposed.

According to the method using a laser, micro LEDs to be transferred are irradiated with a laser, and thus the bonding layer absorbing the laser beam is rapidly raised in temperature and vaporized, whereby the micro LEDs are transferred by gas pressure generated. However, the method using a laser has problems in that the micro LEDs on a second substrate are misaligned by the gas pressure, and a light shielding mask is required to selectively transfer only the micro LEDs to be transferred.

According to the method applying heat, micro LEDs are transferred by conducting heat to an upper surface side of the micro LEDs via a protrusion while a transfer head is in contact with a surface of each of the micro LEDs and thus losing the adhesive strength of the adhesive layer. However, the method using heat has problems in that the transfer head and the micro LEDs are required to be in contact with each other in order to conduct heat, thereby causing problems such as breakage due to contact, misalignment, and the like. In addition, a recess portion is required to be provided in the transfer head to avoid contact with the micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention is to provide a hot air supplying head for transferring a micro LED and a micro LED transfer system using the same, the hot air supplying head effectively transferring micro LEDs.

In order to achieve the above objective, there is provided a hot air supplying head for transferring a micro LED according to the present invention, the hot air supplying head blowing hot air toward a micro LED.

The hot air supplying head may selectively blow hot air toward a micro LED to be transferred.

The hot air supplying head may include: a blowing unit provided with a hole through which hot air is discharged; and a supporting unit supporting the spraying unit.

The spraying unit may be an anodic oxide film.

In order to achieve the above objective, there is provided a micro LED transfer system according to the present invention, the system including: a first substrate provided with a first adhesive layer; a second substrate provided with a second adhesive layer; and a hot air supplying head blowing hot air toward an upper surface of a micro LED on the first substrate. The hot air supplying head removes adhesive strength of the first adhesive layer holding the micro LED and vacuum-sucks the micro LED released from the adhesive strength using a vacuum-suction force applied to a hole of the hot air supplying head to transfer the micro LED to the second substrate.

The hot air supplying head may blow hot air toward the micro LED to bond the micro LED to the second adhesive layer of the second substrate.

The hot air supplying head blows hot air while being in contact with the upper surface of the micro LED.

The hot air supplying head blows hot air while being spaced apart from the upper surface of the micro LED.

At least one of the first substrate and the second substrate is provided with a heater.

In order to achieve the above objective, there is provided a micro LED transfer system according to the present invention, the system including: a first substrate provided with a first adhesive layer; a second substrate provided with a second adhesive layer; a first hot air supplying head blowing hot air toward an upper surface of a micro LED of the first substrate to remove adhesive strength of the first adhesive layer which holds the micro LED; and a transfer head transferring the micro LED to the second substrate from the first substrate.

The transfer head may grip the micro LED using at least one grip force among electrostatic force, van der Waals force, magnetic force, and vacuum suction force and transfer the micro LED to the second substrate from the first substrate.

The first hot air supplying head may blow hot air while being in contact with the upper surface of the micro LED.

The first hot air supplying head may blow hot air while being spaced apart from the upper surface of the micro LED.

At least one of the first substrate and the second substrate may be provided with a heater.

The hot air supplying head may further include: a second hot air supplying head blowing hot air toward the upper surface of the micro LED of the second substrate to impart adhesive strength to the second adhesive layer which holds the micro LED.

As described above, the hot air supplying head for transferring a micro LED and a micro LED transfer system using the same according to the present invention can transfer micro LEDs effectively.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
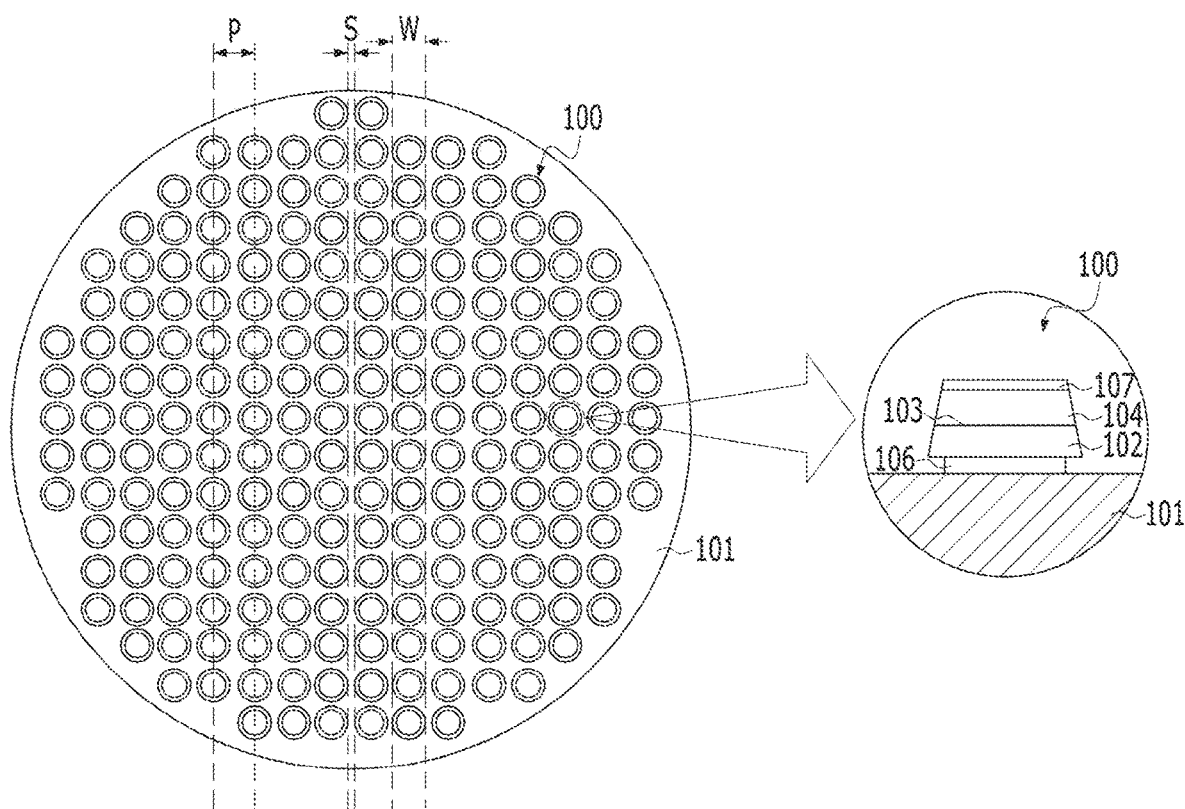
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, a first embodiment of the present invention will be described in detail with reference to the accompanying drawings.

FIG. 1 is a view illustrating multiple micro LEDs 100 to be gripped by a hot air supplying head according to an embodiment of the present invention. The micro LEDs 100 are fabricated and disposed on a growth substrate 101.

The growth substrate 101 may be embodied by a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be made of a semiconductor material having a composition formula of $In_xAl_yGa_{1-x-y}N$ (0≤x≤1, 0≤y≤1, 0≤x+y≤1), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be made of a semiconductor material having a composition formula of $In_xAl_yGa_{1-x-y}N$ (0≤x≤1, 0≤y≤1, 0≤x+y≤1), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ (0≤x≤1, 0≤y≤1, 0≤x+y≤1) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100. The micro LEDs 100 may have a circular cross section, but this is merely illustrative and a cross section of the micro LEDs 100 is not limited to this. The micro LEDs 100 may have various cross-sectional shapes, such as polygonal, rectangular, circular, conical, elliptical, and triangular.

Figure 2:
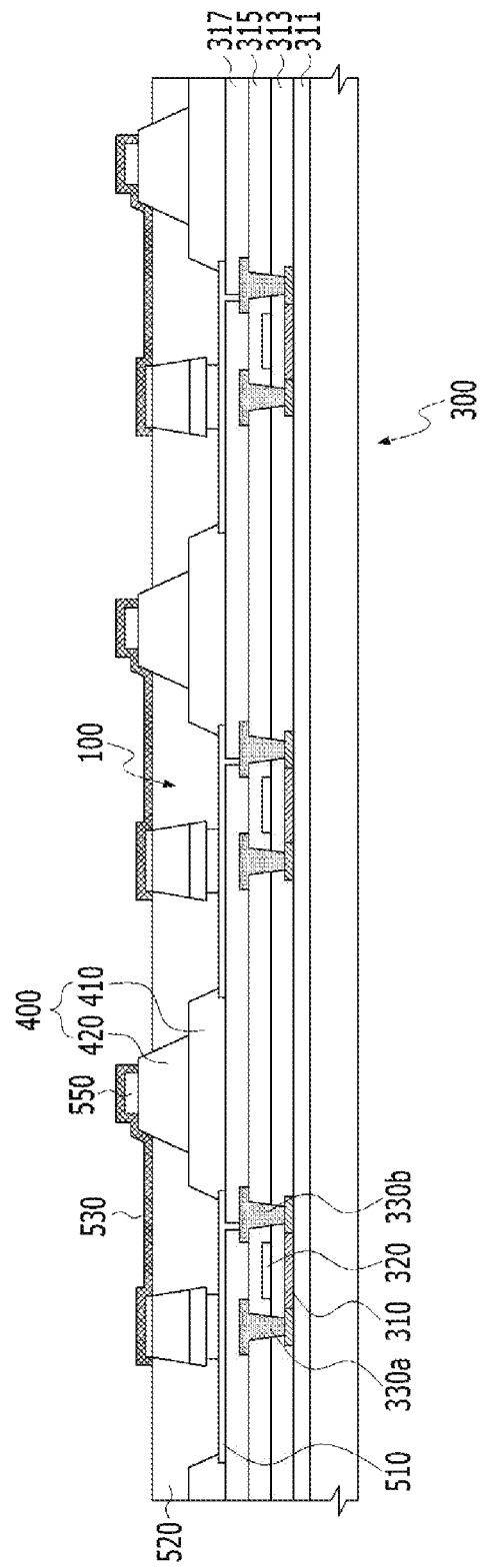
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted on a display substrate by the hot air supplying head according to the embodiment of the present invention.

A display substrate 300 may include various materials. For example, the display substrate 300 may be made of a transparent glass material having $SiO_2$ as a main component. However, materials of the display substrate 300 are not limited to this, and the display substrate 300 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 300, the display substrate 300 is required to be made of a transparent material. However, in the case of a top emission type in which an image is implemented in a direction opposite to the display substrate 300, the display substrate 300 is not required to be made of a transparent material. In this case, the display substrate 300 may be made of metal.

In the case of forming the display substrate 300 using metal, the display substrate 300 may be made of at least one metal selected from among the group consisting of iron, chromium, manganese, nickel, titanium, molybdenum, stainless steel (SUS), Invar, Inconel, and Kovar, but is not limited thereto.

The display substrate 300 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. Each of the source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross-sectional shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 300 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

Each of the micro LEDs 100 is disposed in each recess. The micro LED 100 may be electrically connected to the first electrode 510 at the recess.

The micro LEDs 100 emit light having wavelengths of different colors such as red, green, blue, white, and the like. With the micro LEDs 100, it is possible to realize white light by using fluorescent materials or by combining colors. A size of the micro LEDs 100 is several micrometers. A transfer head according to an embodiment of the present invention picks up the micro LEDs 100 from the growth substrate 101 individually or collectively and transfers to the display substrate 300 so that each of the micro LEDs 100 are received in the recess of the display substrate 300.

Each of the micro LEDs 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

Figure 3:
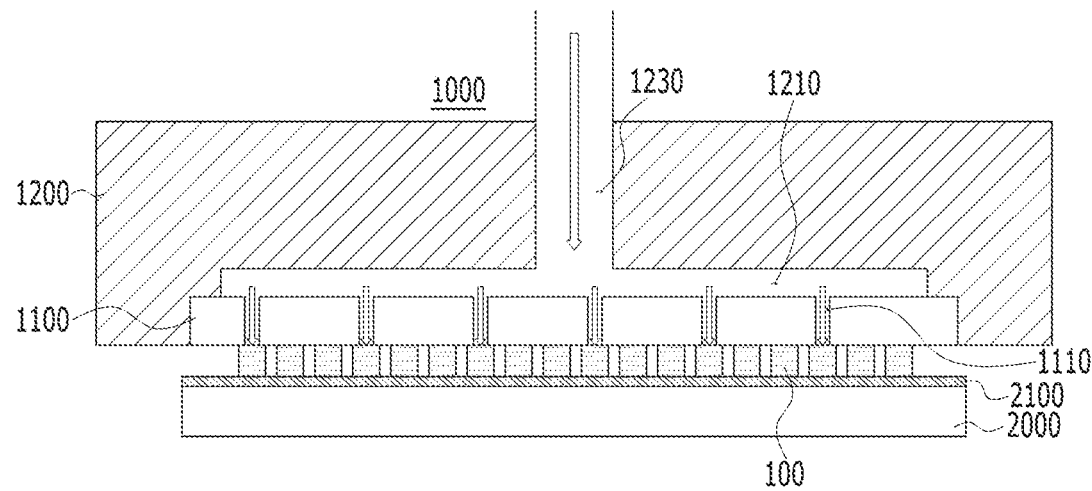
FIG. 3 is a view illustrating a hot air supplying head of a transfer system according to a first embodiment of the present invention blowing hot air while being in contact with upper surfaces of micro LEDs of a first substrate.
Figure 4:
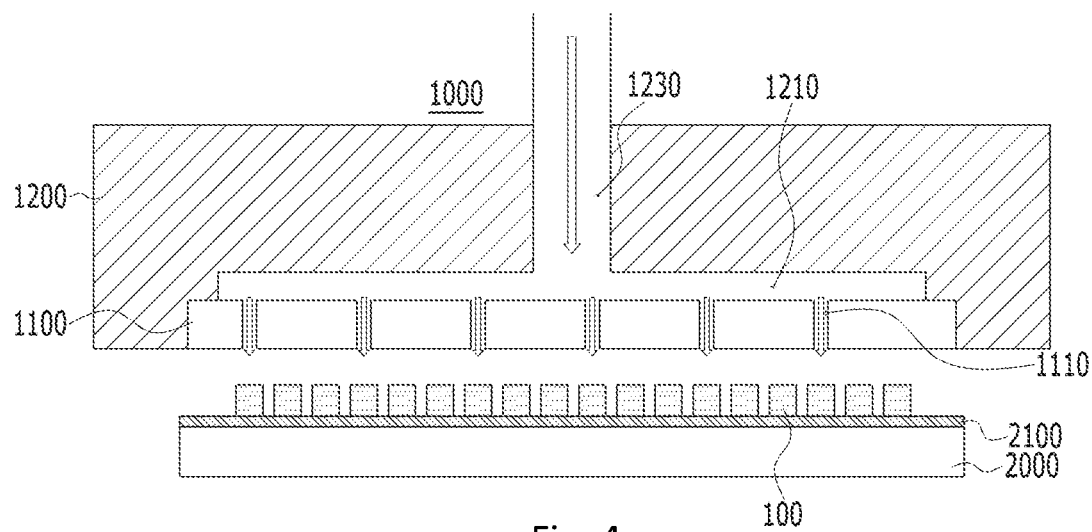
FIG. 4 is a view illustrating the hot air supplying head of the transfer system according to the first embodiment of the present invention blowing hot air while being spaced apart from the upper surfaces of the micro LEDs of the first substrate.

Micro LED Transfer System According to a First Embodiment of the Present Invention FIG. 3 and FIG. 4 are views illustrating a hot air supplying head of a micro LED transfer system according to a first embodiment of the present invention, wherein FIG. 3 is a view illustrating the hot air supplying head of the transfer system according to the first embodiment of the present invention blowing hot air while being in contact with upper surfaces of the micro LEDs of a first substrate; and FIG. 4 is a view illustrating the hot air supplying head of the transfer system according to the first embodiment of the present invention blowing hot air while being spaced apart from the upper surfaces of the micro LEDs of the first substrate.

Referring to FIG. 3 and FIG. 4, a hot air supplying head 1000 includes: a blowing unit 1100 blowing hot air; and a supporting unit 1200 supporting the blowing unit 1100 so that hot air is blown toward the micro LEDs 100.

The blowing unit 1100 is configured with holes 1110 through which hot air is discharged in order to blow hot air through the holes 1110. The holes 1110 are configured to extend the blowing unit 1100 from top to bottom. The blowing unit 1100 may be made of a material such as a metal, a non-metal, a ceramic, a glass, quartz, a silicone (PDMS), or a resin as long as the holes 1110 can be formed to have a width of several tens of micrometers or less. In the case where the blowing unit 1100 is made of a metal, it is possible to prevent the generation of static electricity during the transfer of the micro LEDs 100. In the case where the blowing unit 1100 is made of a non-metal, it is possible to minimize the influence of the blowing unit 1100 on the micro LEDs 100 having the property of metal. In the case where the blowing unit 1100 is made of a ceramic, a glass, quartz, or the like, it is possible to secure rigidity and minimize a positional error due to a low thermal expansion coefficient thereof, which may occur due to thermal deformation of the blowing unit 1100 during the transfer of the micro LEDs 100. In the case where the blowing unit 1100 is made of a silicone (PDMS), it is possible to function as a buffer and minimize damage which may be caused by collision between a lower surface of the blowing unit 1100 and the upper surfaces of the micro LEDs 100. In the case where the blowing unit 1100 is a resin, it is possible to facilitate the manufacture of the blowing unit 1100.

The holes 1110 configured in the blowing unit 1100 may be configured to be spaced apart from each other at regular distances in an x-direction (row direction) and/or a y-direction (column direction) in a manner corresponding with the micro LEDs 100 on a one-to-one basis, which are arranged on a first substrate 2000. This allows for batch detaching of the micro LEDs 100 from a first substrate 2000.

Alternatively, the blowing unit 1100 may selectively blow hot air toward only the micro LEDs 100 to be transferred. The holes 1110 here may be spaced apart from each other in at least one of the x-direction and the y-direction at least two times the pitch distance of the micro LEDs 100 arranged on the first substrate 2000. For example, FIG. 4 to FIG. 5B illustrate that the micro LEDs 100 are spaced apart from each other at three times the pitch distance in one direction. This considers the pixel arrangement on the display substrate 300.

The first substrate 2000 may be the growth substrate 101 illustrated in FIG. 1 or may be a temporary substrate or a carrier substrate to which the micro LEDs are temporarily transferred from the growth substrate 101.

The supporting unit 1200 is provided to support the blowing unit 1100. The supporting unit 1200 is made of a metal material to prevent warpage. The supporting unit 1200 has a thermal expansion coefficient almost equal to that of the blowing unit 1100. Thus, when the blowing unit 1100 is thermally deformed by thermal energy in a transfer space, the blowing unit 1100 is thermally deformed together with the blowing unit 1100 to prevent damage to the blowing unit 1100.

A chamber 1210 is defined between the blowing unit 1100 and the supporting unit 1200. The chamber 1210 is an empty space defined between an upper surface of the blowing unit 1100 and an inner lower surface of the supporting unit 1200 and allows hot air to be uniformly distributed to the holes 1110 of the blowing unit 1100.

The supporting unit 1200 is provided with a through-port 1230 communicating with the chamber 1210. The chamber 1210 is provided between the through-port 1230 and the multiple holes 1110 to distribute and supply hot air supplied via the through-port 1230 to the multiple holes 1110. In other words, hot air supplied via the through-port 1230 is horizontally diffused by the chamber 1210, and the diffused hot air is discharged to the outside through the holes 1110 of the blowing unit 1100 and through a blow surface of the blowing unit 1100.

A first adhesive layer 2100 is provided on an upper surface of the first substrate 2000. The first adhesive layer 2100 bonds and holds the micro LEDs 100 when arranging the micro LEDs 100. Afterward, the first adhesive layer 2100 allows the micro LEDs 100 to be removed therefrom when separating the micro LEDs 100 from the first substrate 2000. The first adhesive layer 2100 is preferably made of a thermoplastic material, and a sheet made of a thermoplastic resin or made of a thermally releasable material is suitable. In the case in which the thermoplastic resin is used, the thermoplastic resin is plasticized by heating the first adhesive layer 2100, thereby reducing the adhesive strength of the first adhesive layer 2100 which holds the micro LEDs 100 so that the micro LEDs 100 can be easily removed from the first adhesive layer 2100. In addition, the thermally releasable material here refers to a material in which a foaming agent or an expanding agent contained in a material is heated and thus foamed or expanded, leading to reduction in adhesive area and loss of adhesive strength.

The first adhesive layer 2100 may be provided with a release layer (not illustrated) on the first substrate 2000, and the first adhesive layer 2100 may be disposed on the release layer. The release layer here may be, for example, a fluorine coating, a silicone resin, a water-soluble adhesive (for example, PVA), or a polyimide.

FIG. 3 and FIG. 4 illustrate an example that eighteen micro LEDs 100 are disposed on the first substrate 2000. The blowing unit 1100 is provided with six holes 1110 corresponding to the first, fourth, seventh, tenth, thirteenth, and sixteenth micro LEDs 100 present on the first substrate 2000. Hot air discharged through the six holes 1100 heats upper surfaces of the first, fourth, seventh, tenth, thirteenth, and sixteenth micro LEDs 100 present on the first substrate 2000. This results in loss of adhesive strength of the first adhesive layer 2100 holding the first, fourth, seventh, tenth, thirteenth, and sixteenth micro LEDs 100, and results that adhesive strength holding the micro LEDs 100 other than the first, fourth, seventh, tenth, thirteenth, and sixteenth micro LEDs 100 is not lost. Therefore, only the first, fourth, seventh, tenth, thirteenth, and sixteenth micro LEDs 100 can be removed from first substrate 2000 and then transferred.

Figure 5A:
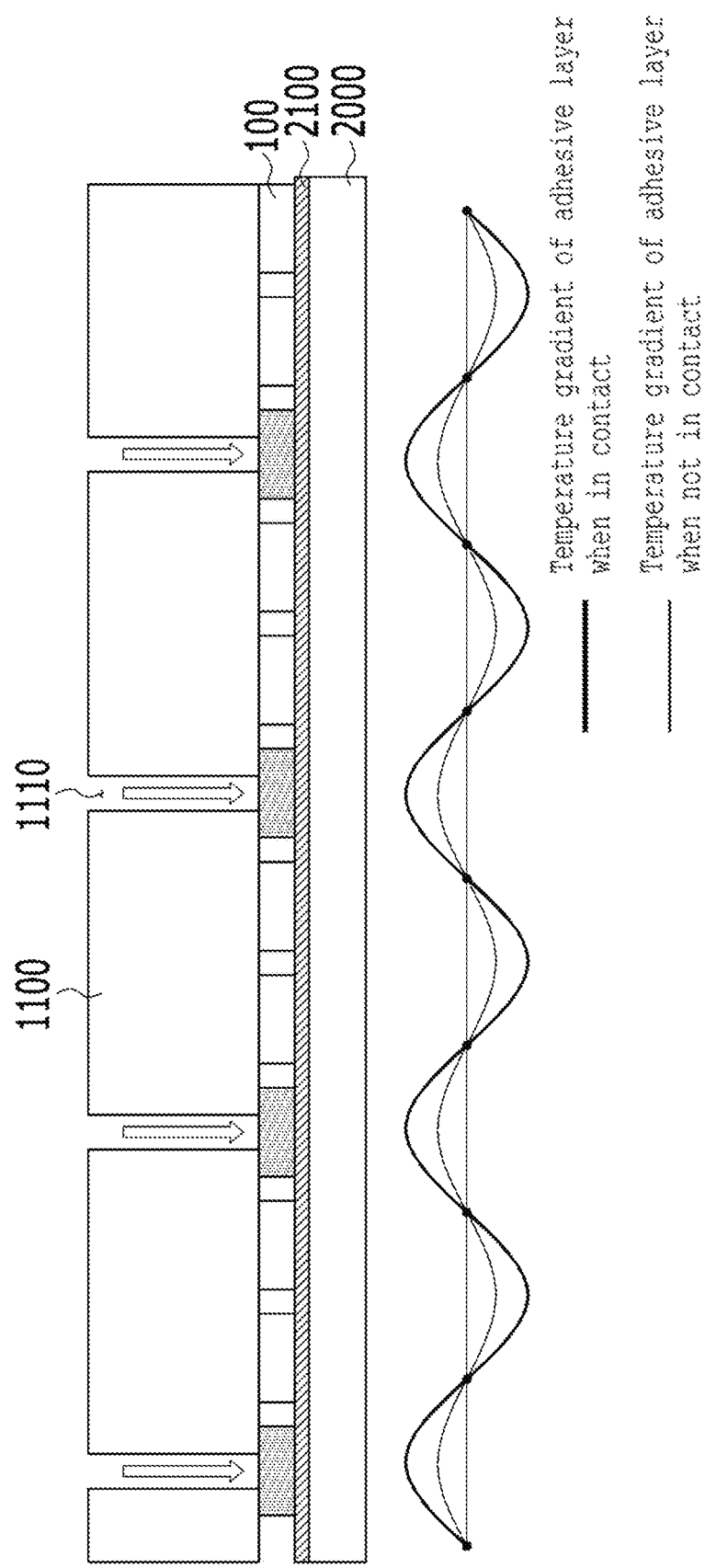
FIG. 5A and FIG. 5B are views illustrating the hot air supplying head of the transfer system according to the first embodiment of the present invention removing an adhesive strength of a first adhesive layer of a first substrate.
Figure 5B:
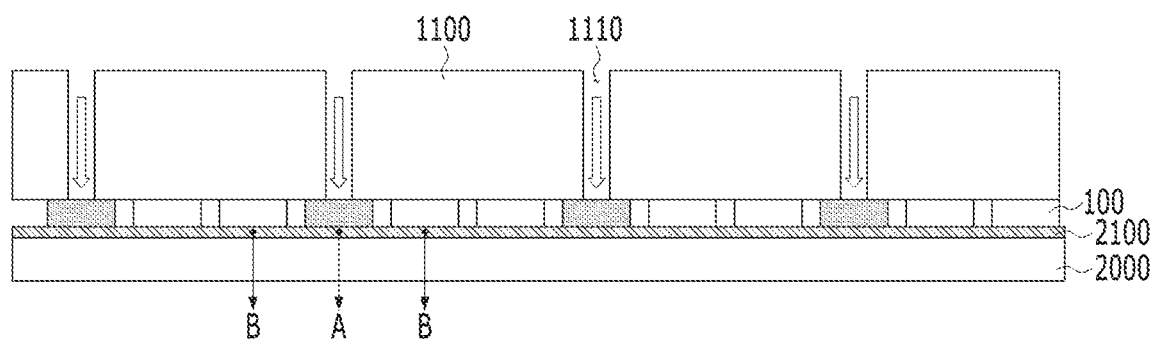

Referring to FIG. 5A, hot air supplied via the holes 1110 heats the micro LEDs 100 in the corresponding positions so that regions of the first adhesive layer 2100 at positions corresponding to the holes 1100 are also heated. Accordingly, the regions of the first adhesive layer 2100 corresponding to the micro LEDs 100 to be transferred have a temperature gradient. When the first adhesive layer 2100 is heated to a predetermined temperature, for example, to 200° C. or above, the first adhesive layer 2100 loses the adhesive strength, wherein the adhesive strength with lower surfaces of the micro LEDs 100 to be transferred is completely lost or lost below a predetermined adhesive strength. As illustrated in FIG. 3, when the hot air supplying head 1000 is in contact with the micro LEDs 100, heat energy is more concentrated in the first adhesive layer 2100 than in the case where the hot air supplying head 1000 is not in contact with the micro LEDs 100, thereby easily removing the micro LEDs 100 from the first adhesive layer 2100.

The micro LEDs 100 not being disposed at the positions corresponding to the holes 1110 are impossible to receive hot air from the holes 1110 so that a portion of the first adhesive layer 2100 below the micro LEDs 100 is not heated to a predetermined temperature or more. As a result, the micro LEDs 100 not to be transferred remain held by the first adhesive layer 2100.

Referring to FIG. 5B, a region of the first adhesive layer 2100 indicated by 'A' corresponds to the holes 1100 and a region where the adhesive strength is lost by hot air supplied via the holes 1100. A region of the first adhesive layer 2100 indicated by 'B' is a region where corresponding holes 1100 are not provided and is a region where the adhesive strength is maintained because there is no hot air supplied via the holes 1100.

Figure 6:
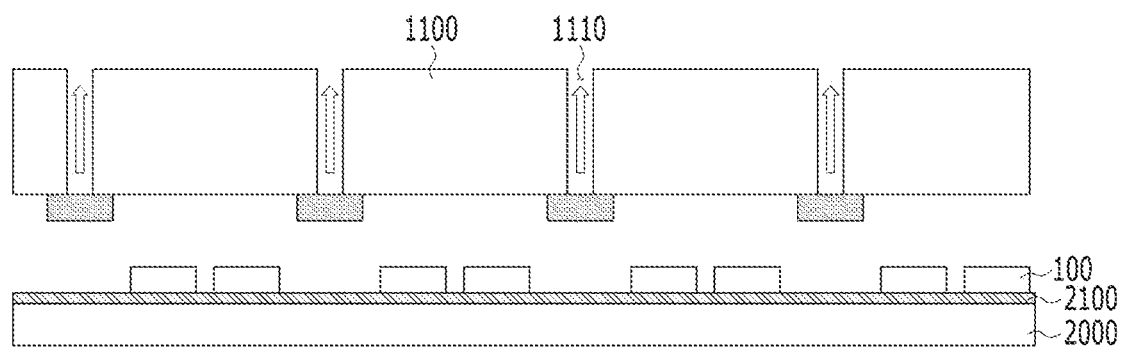
FIG. 6 is a view illustrating the hot air supplying head of the transfer system according to the first embodiment of the present invention vacuum-sucking micro LEDs released from the adhesive strength.

As described above, with respect to the micro LEDs 100 bonded to the first substrate 2000 by the first adhesive layer 2100, hot air supplied by the hot air supplying head 1000 causes a difference in the adhesive strength of the first adhesive layer 2100 holding the micro LEDs 100 to be transferred and holding the micro LEDs 100 not to be transferred. As illustrated in FIG. 6, the desired micro LEDs 100 can be selectively transferred in a batch manner.

The first substrate 2000 may be provided with a heater (not illustrated). When the hot air supplying head 1000 blows hot air through the upper surfaces of the micro LEDs 100, the heater provided in the first substrate 2000 operates to raise the temperature of the lower surfaces of the micro LEDs 100 such that a predetermined temperature at which the first adhesive layer 2100 loses the adhesive strength is easily reached.

Hereinafter, a transfer process of the micro LED transfer system according to the first embodiment of the present invention will be described with reference to FIG. 7A to FIG. 7F.

Figure 7:
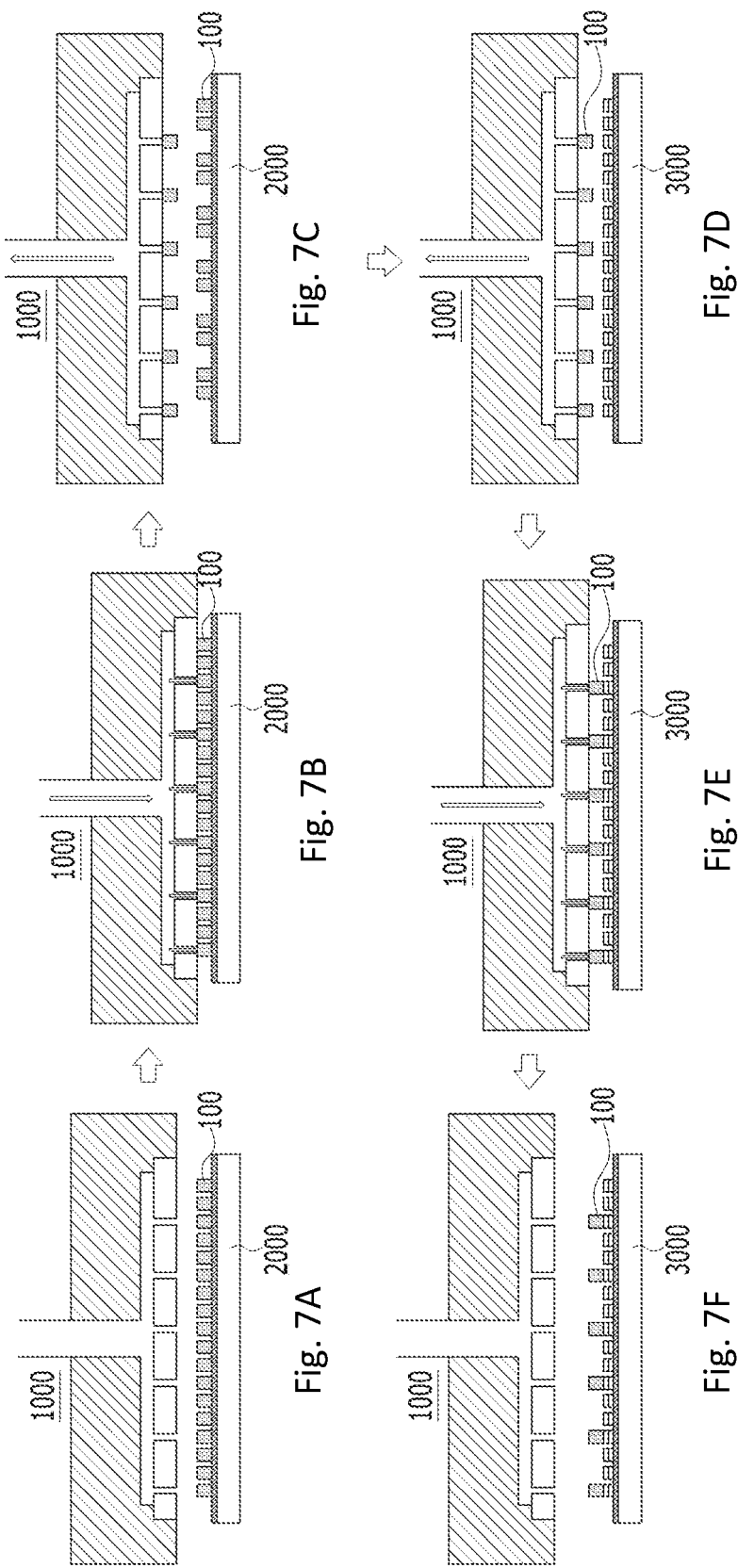
FIG. 7A to FIG. 7F are views illustrating a micro LED transfer process of the transfer system according to the first embodiment of the present invention.

As illustrated in FIG. 7A, the first substrate 2000 is provided with the first adhesive layer 2100. The micro LEDs 100 are held on the first substrate 2000 via the first adhesive layer 2100. The hot air supplying head 1000 is positioned over the first substrate 2000.

Next, as illustrated in FIG. 7B, hot air is selectively discharged via the holes 1110 of the blowing unit 1100 of the hot air supplying head 1000. The hot air supplying head 1000 here may supply hot air while being in contact with the upper surfaces of the micro LEDs 100 or may supply hot air while being spaced apart from the upper surfaces of the micro LEDs 100. As a result, the first adhesive layer 2100 partly loses the adhesive strength holding the micro LEDs 100 disposed on the first substrate 2000. In other words, the first adhesive layer 2100 loses the adhesive strength holding the micro LEDs 100 on the positions corresponding to the holes 1110 of the hot air supplying head, and maintains the adhesive strength holding the micro LEDs 100 on the positions not corresponding to the holes 1110. The micro LEDs 100 not to be transferred remain held on the first substrate 2000 until the adhesive strength holding the same is lost by the hot air supplying head 1000 in the subsequent transfer cycle.

Next, as illustrated in FIG. 7C, the hot air supplying head 1000 makes a vacuum in the holes 1110 and vacuum-sucks only the micro LEDs 100 to be transferred. The holes 1100 have two functions. Specifically, when removing only the micro LEDs 100 to be transferred from the first adhesive layer 2100 of the first substrate 2000, the holes 1100 function as passages for blowing hot air toward the micro LEDs 100. On the other hand, after the micro LEDs 100 to be transferred are removed from the first adhesive layer 2100, the holes 1100 function as passages for providing vacuum pressure generated by a vacuum pump to the micro LEDs 100 while gripping the micro LEDs 100. As described above, the hot air supplying head 1000 vacuum-sucks the micro LEDs 100 using the vacuum suction force applied to the holes 1110 and transfers the micro LEDs 100 to a second substrate 3000, the micro LEDs 100 being released from the adhesive strength of the first adhesive layer 2100.

Next, as illustrated in FIG. 7D, the hot air supplying head 1000 moves over the second substrate 3000. The second substrate 3000 may be a temporary substrate, a carrier substrate, or a display substrate schematically illustrating the display substrate 300 of FIG. 2. In the case where the second substrate 3000 is the display substrate 300 illustrated in FIG. 2, the second substrate 3000 is configured with an electrode layer 3300 electrically connected to the first contact electrode 106 of each of the micro LEDs 100. A second adhesive layer 3100 is provided on the electrode layer 3300 to electrically connect the first contact electrode 106 of each of the micro LED 100 and the electrode layer 3300 with each other and to hold the micro LEDs 100 on the second substrate 3000.

Next, as illustrated in FIG. 7E, the hot air supplying head 1000 releases the vacuum pressure applied to the holes 1110 and transfers the micro LEDs 100 to the second substrate 3000. Thereafter, the hot air supplying head 1000 supplies hot air via the holes 1110 to bond the micro LEDs 100 to the second adhesive layer 3100 of the second substrate 3000. In other words, the hot air supplying head 1000 blows hot air toward the micro LEDs 100 to bond the micro LEDs 100 to the second adhesive layer 3100 of the second substrate 3000.

Figure 8:
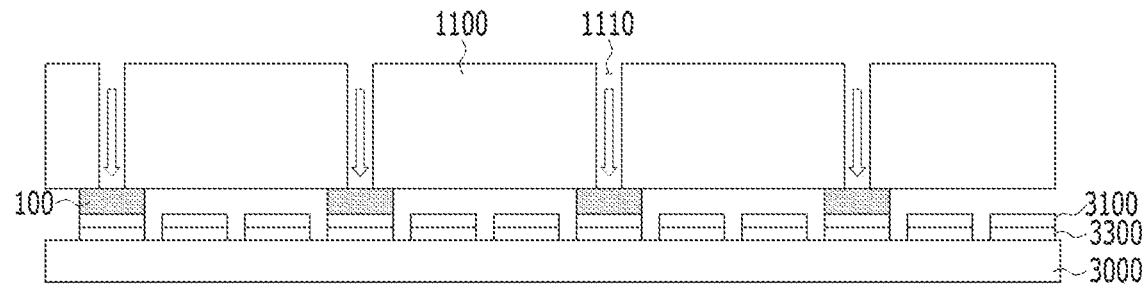
FIG. 8 is a view illustrating the hot air supplying head of the transfer system according to the first embodiment of the present invention bonding the micro LEDs to a second adhesive layer of a second substrate.

As illustrated in FIG. 8, the second adhesive layer 3100 is provided on the second substrate 3000 to bond the micro LEDs 100 to the second substrate 3000. A process of bonding the micro LEDs 100 is performed by applying heat and/or pressure to the second adhesive layer 3100. A metal bonding method may be used to bond the micro LEDs 100 to the second adhesive layer 3100. According to the metal bonding method, a bonding metal (alloy) is heated to be molten in order to bond the micro LEDs 100 to the electrode layer 3300. As the metal bonding method, thermocompression bonding, eutectic bonding, or the like may be applied.

The second adhesive layer 3100 may be made of an electrically conductive adhesive material comprising conductive particles. For example, the second adhesive layer 3100 may be composed of an anisotropic conductive film (ACF) or an anisotropic conductive adhesive. The ACF is in a state in which cores of a conductive material are composed of multiple particles covered with an insulating film. When pressure or heat is applied to the ACF, the insulating film is destroyed at a region to which pressure or heat is applied such that the region of the ACF is electrically connected via an exposed core of the ACF. The second adhesive layer 3100 may be formed using conductive pads, conductive bumps, conductive balls, conductive pins, and the like. In this case, the conductive pads, bumps, balls, pins, and the like may be made of a conductive material such as solder, a conductive polymer, or a conductive oxide. The second adhesive layer 3100 may be made of a material such as a thermoplastic polymer or a thermosetting polymer. A material of the second adhesive layer 3100 may be selected from materials for bonding the micro LEDs 100, and eutectic alloy bonding joining metals by heating to a predetermined temperature, transient liquid phase bonding, or solid phase diffusion bonding may be used to bond the micro LEDs 100.

The second substrate 3000 may be provided with a heater (not illustrated). When the hot air supplying head 1000 blows hot air through the upper surfaces of the micro LEDs 100, the heater provided in the second substrate 3000 operates to raise the temperature of the lower surfaces of the micro LEDs 100 such that it is possible to heat the second adhesive layer 3100 from the underside thereof. When bonding the micro LEDs 100 to the second substrate 3000 using a metal bonding method such as eutectic bonding, only the second substrate 3000 is heated so that a cold solder joint may occur due to a temperature difference between upper and lower portions of the second adhesive layer 3100. In other words, when bonding the micro LEDs 100 by heating only the second substrate 3000, the temperature is lowered toward an upper surface of a bonding metal (alloy), causing a cold solder joint. This causes the micro LEDs 100 to be not firmly bonded to the electrode layer 3300.

However, after the micro LEDs 100 are transferred to the second substrate 3000, the hot air supplying head 1000 according to the first embodiment of the present invention supplies hot air via the holes 1110 in the bonding process to heat the upper surfaces of the micro LEDs 100 whereby the micro LEDs 100 are firmly bonded to the electrode layer 3300.

Since the vacuum-suction force is released and the hot air supplying head 1000 is still not raised, the lower surface of the blowing unit 1100 and the upper surfaces of the micro LEDs 100 may be in contact with each other. The upper surfaces of the transferred micro LEDs 100 are heated by supplying hot air to the holes 1100, and the heater (not illustrated) heats the lower surface of the second adhesive layer 3100. Thus, the temperature gradient of the second adhesive layer 3100 becomes uniformized regardless of the depth of the second adhesive layer 3100, thereby preventing cold solder joint. As a result, the micro LEDs 100 are firmly bonded to the electrode layer 3300 of the second substrate 3000, thereby improving the efficiency of bonding the micro LEDs 100.

After the hot air supplying head 1000 transfers the micro LEDs 100 to the second substrate 3000, the hot air supplying head 1000 is raised to a predetermined height and supplies hot air via the holes 1110 of the blowing unit 1100 while the blowing unit 1100 is spaced apart from the upper surfaces of the micro LEDs 100.

Next, as illustrated in FIG. 7F, the hot air supplying head 1000 moves to a first substrate where micro LEDs 100 of different colors exist to transfer other micro LEDs 100 to the second substrate 3000. In the case when the micro LEDs 100 transferred in the process illustrated in FIG. 7A to FIG. 7F are red LEDs, the hot air supplying head 1000 may perform a process for transferring green LEDs to the second substrate 3000.

According to the transfer system of the first embodiment of the present invention, a single hot air supplying head 1000 functions to detach the micro LEDs 100 from the first substrate 2000, to transfer the micro LEDs 100 to the second substrate 3000 from the first substrate 2000, and to bond the micro LEDs 100 to second substrate 3000.

Figure 9:
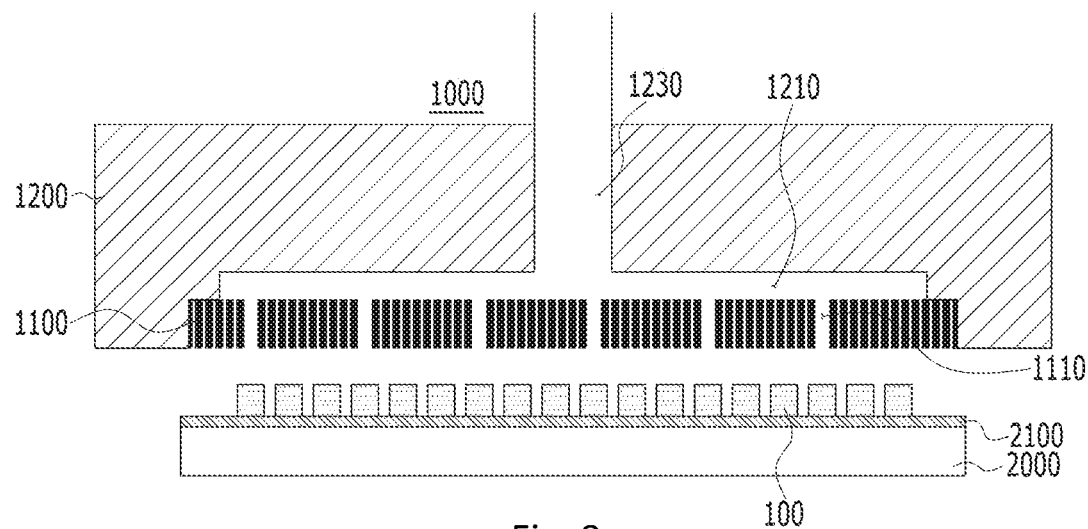
FIG. 9 is a view illustrating a first modification of the hot air supplying head of the transfer system according to the first embodiment of the present invention.

FIG. 9 is a view illustrating a first modification of the hot air supplying head of the transfer system according to the first embodiment of the present invention.

The first modification of the hot air supplying head 1000 of differs from the hot air supplying head 1000 according to the first embodiment in that a blowing unit 1100 of the first modification is embodied by an anodic oxide film formed by anodizing a metal, but the rest of the configuration is the same.

The anodic oxide film is a film formed by anodizing a metal that is a base material, and pores are pores formed in a process of forming the anodic oxide film by anodizing the metal. For example, in the case where a metal base material is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which the pores are not formed and a porous layer in which the pores are formed inside. The barrier layer is positioned on an upper portion of the base material, and the porous layer is positioned below the barrier layer. After removing the base material on which the anodic oxide film having the barrier layer and the porous layer is formed, only an anodic oxide film consisting of anodized aluminum ($Al_2O_3$) remains. An internal width of the pores has a size of several nanometers to several hundred nanometers.

When such anodic oxide film is etched by using a mask, vertical holes are formed at the etched portion. Unlike pores formed naturally in the anodic oxide film, the holes are formed to have a large width, and the holes become the holes 1110 of the first modification of the hot air supplying head 1000. In the case where the anodic oxide film is used as the blowing unit 1100, it is possible to easily form the vertical holes 1110 in a vertical direction (z-axis direction) by using reaction between the anodic oxide film and an etching solution.

The thermal expansion coefficient of the anodic oxide film is 2 ppm/° C. to 3 ppm/° C. Thus, it is possible to minimize the thermal deformation of the anodic oxide film caused by peripheral heat when the first modification of the hot air supplying head 1000 grips and transfers the micro LEDs 100, thereby reducing positional errors remarkably.

Figure 10:
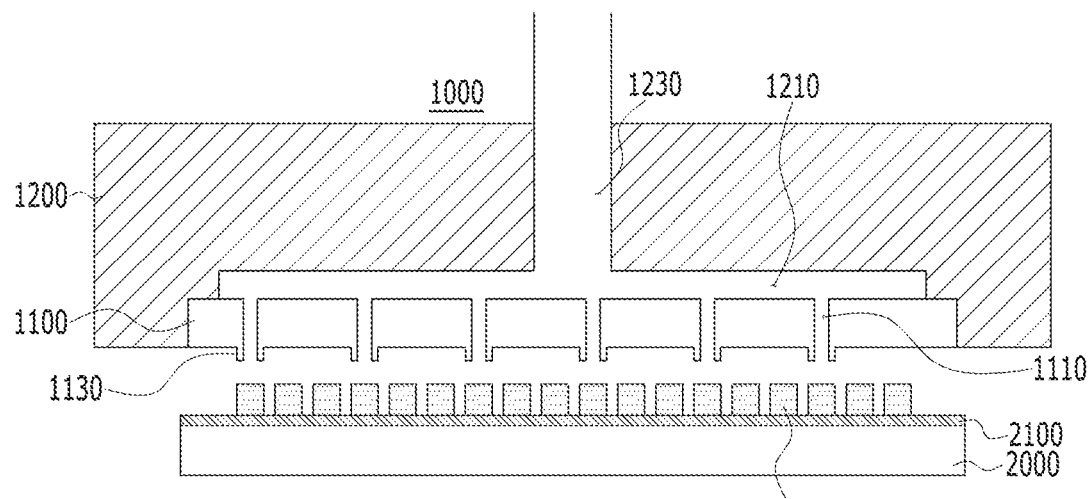
FIG. 10 is a view illustrating a second modification of the hot air supplying head of the transfer system according to the first embodiment of the present invention.

FIG. 10 is a view illustrating a second modification of the hot air supplying head of the transfer system according to the first embodiment of the present invention. The second modification of the hot air supplying head 1000 differs from the hot air supplying head 1000 according to the first embodiment in that protrusions 1130 are formed at the ends of the holes 1110, but the rest of the configuration is the same.

The protrusions 1130 are configured to protrude downward, and each of the holes 1110 extends from top to bottom at a central portion of each of the protrusions 1130. Accordingly, recess portions are formed at the periphery of the protrusions 1130 due to the structure of the protrusions 1130. According to the structure in which the holes 1110 are formed in the protrusions 1130 and the recess portions are formed at the periphery of the protrusions 1130, when gripping the micro LEDs 100 using the holes 1110, adjacent micro LEDs 100 do not interfere with each other due to the recess portions, thereby improving the transfer efficiency.

Figure 11:
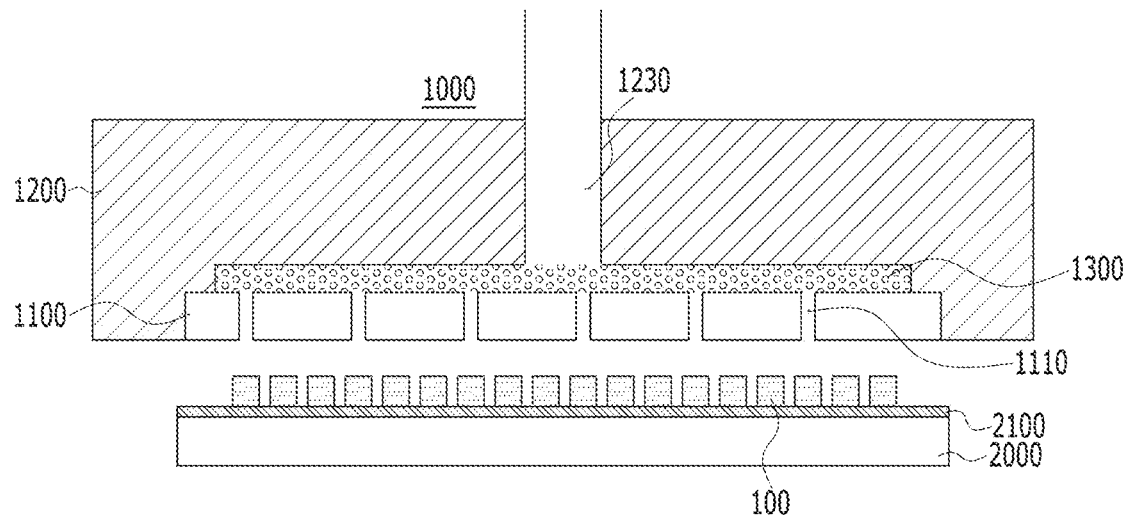
FIG. 11 is a view illustrating a third modification of the hot air supplying head of the transfer system according to the first embodiment of the present invention.

FIG. 11 is a view illustrating a third modification of the hot air supplying head of the transfer system according to the first embodiment of the present invention.

The third modification of the hot air supplying head 1000 differs from the hot air supplying head 1000 according to the first embodiment in that a porous unit 1300 is provided inside the chamber 1210, but the rest of the configuration is the same.

The porous unit 1300 may be composed of a material containing a large number of pores therein, and may be formed in a form of a powder, a thin film, a thick film, or a bulk having a porosity of about 0.2 to 0.95 in a predetermined arrangement or disordered pore structure. The pores of the porous unit 1300 are classified according to pore sizes thereof: micropores having a pore diameter of 2 nm or less, mesopores having a pore diameter of 2 nm to 50 nm, and macropores having a pore diameter of 50 nm or more. The porous unit 1300 may include at least some of micropores, mesopores, and macropores. Porous materials of the porous unit 1300 are classified according to constituent components thereof: organic, inorganic (ceramic), metal, and hybrid type. The porous unit 1300 may be formed in a form of a powder, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous unit 1300 have the disordered pore structure, the multiple pores are connected to each other inside the porous unit 1300 such that flow paths are formed and connect upper and lower portions of the porous unit 1300. The porous unit 1300 may become porous by sintering aggregate composed of inorganic granules and a binder that bonds aggregate. In this case, the multiple pores of the porous unit 1300 are irregularly connected to each other to form gas flow paths, and the top and bottom surfaces of the porous unit 1300 communicate with each other by the gas flow paths.

The porous unit 1300 is provided between the through-port 1230 and the blowing unit 1100 to prevent deformation of the blowing unit 1100 and to distribute hot air and the suction force transmitted from the through-port 1230 in the horizontal direction in order to transfer the distributed hot air and suction force to the blowing unit 1100. Thus, the hot air and the vacuum pressure transmitted to the multiple holes 1110 can be uniformized by the porous unit 1300.

Figure 12:
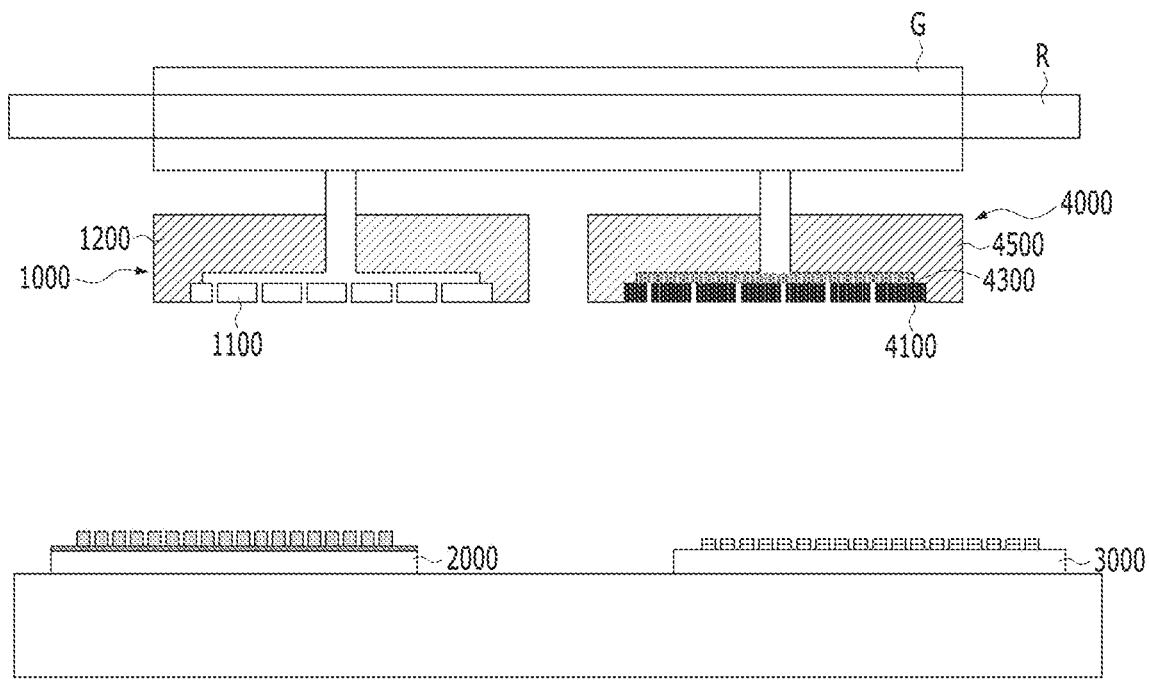
FIG. 12 is a view illustrating a transfer system according to a second embodiment of the present invention.

Micro LED Transfer System According to a Second Embodiment of the Present Invention FIG. 12 is a view illustrating a micro LED transfer system according to a second embodiment of the present invention.

The micro LED transfer system according to the second embodiment of the present invention differs from the micro LED transfer system according to the first embodiment in that a hot air supplying head 1000 and a transfer head 4000 are moved together by a single driving unit G. Referring to FIG. 12, the driving unit G is provided with the hot air supplying head 1000 at a first side thereof and the transfer head 4000 at a second side thereof. The driving unit G is movably installed along a rail R.

The micro LED transfer system according to the second embodiment of the present invention includes: a first substrate 2000 provided with a first adhesive layer 2100; a second substrate 3000 provided with a second adhesive layer 3100; the hot air supplying head 1000 blowing hot air toward upper surfaces of the micro LEDs 100 of the first substrate 2000 to remove adhesive strength of the first adhesive layer 2100; and the transfer head 4000 transferring the micro LEDs 100 to the second substrate 3000 from the first substrate 2000.

Here, the hot air supplying head 1000 functions to detach the micro LEDs 100 from the first substrate 2000 and bond the micro LEDs 100 to the second substrate 3000. The transfer head 4000 functions to transfer the detached micro LEDs 100 to the second substrate 3000 from the first substrate 2000.

With the configuration in which the hot air supplying head 1000 and the transfer head 4000 are coupled and moved together by the single driving unit G, the hot air supplying head 1000 descends and blows hot air only to the micro LEDs 100 on the first substrate 2000 to be transferred in order to remove the adhesive strength of the first adhesive layer 2100 of the first substrate 2000. Then, the hot air supplying head 1000 is raised, and the transfer head 4000 descends, grips the micro LEDs 100 to be transferred, and transfers the same to the second substrate 3000. The transfer head 4000 is raised from the second substrate 3000, and the hot air supplying head 1000 descends and blows hot air to the micro LEDs 100 transferred to the second adhesive layer 3100 of the second substrate 3000 to bond and hold the micro LEDs 100 on the second substrate 3000.

The hot air supplying head 1000 according to the second embodiment includes: a blowing unit 1100 blowing hot air; and a supporting unit 1200 supporting the blowing unit 1100. The hot air supplying head 1000 may be embodied as the hot air supplying head 1000 according to the first embodiment and the modifications of the hot air supplying head 1000.

The transfer head 4000 grips the micro LEDs 100 using at least grip force among electrostatic force, van der Waals force, magnetic force, and vacuum suction force and transfers the micro LEDs 100 to the second substrate 3000 from the first substrate 2000.

The transfer head 4000 includes: a grip unit 4100 on which the micro LEDs 100 are gripped; and a supporting unit 4500 supporting the grip unit 4100. The micro LEDs 100 are gripped by the grip unit 4100, wherein the grip unit 4100 grips the micro LEDs 100 using at least one grip force among the above-described forces such as the electrostatic force, the van der Waals force, the magnetic force, and the vacuum-suction force.

For example, the grip unit 4100 may vacuum-suck the micro LEDs 100 using the vacuum-suction force. The grip unit 4100 may be embodied by an anodic oxide film. The inside of the anodic oxide film forms air flow paths in a vertical shape by vertical pores so that it is possible to vacuum-suck the micro LEDs 100 via the air flow paths.

A porous unit 4300 is provided on the grip unit 4100. The porous unit 4300 may be composed of a material containing a large number of pores therein, and may be formed in a form of a powder, a thin film, a thick film, or a bulk having a porosity of about 0.2 to 0.95 in a predetermined arrangement or disordered pore structure. The pores of the porous unit 4300 are classified according to pore sizes thereof: micropores having a pore diameter of 2 nm or less, mesopores having a pore diameter of 2 nm to 50 nm, and macropores having a pore diameter of 50 nm or more. The porous unit 4300 may include at least some of micropores, mesopores, and macropores. Porous materials of the porous unit 4300 are classified according to constituent components thereof: organic, inorganic (ceramic), metal, and hybrid type. The porous unit 4300 may be formed in a form of a powder, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

The porous unit 4300 functions to support the grip unit 4100 provided under the porous unit 4300 and distribute vacuum pressure horizontally so that, with the pores of the grip unit 4100, hundreds of thousands of to millions of micro LEDs 100 can be vacuum-sucked in a batch manner without errors.

An arrangement of suction holes generating the vacuum suction force in the grip unit 4100 of the transfer head 4000 may be the same as an arrangement of holes 1110 formed in the blowing unit 1100 of the hot air supplying head 1000. With the above-mentioned configuration, the hot air supplying head 1000 selectively removes the adhesive strength with respect to the micro LEDs 100 bonded to the first adhesive layer 2100 of the first substrate 2000, the micro LEDs 100 to be transferred are released from the adhesive strength, and the transfer head 4000 transfers the released micro LEDs 100 to the second substrate 3000.

As a configuration in which the micro LEDs 100 are selectively transferred to the second substrate 3000 from the first substrate 2000, other than the configuration in which the adhesive strength is selectively lost and the micro LEDs 100 are selectively transferred, the hot air supplying head 1000 may employ a configuration in which hot air is blown to the entire micro LEDs 100 bonded to the first adhesive layer 2100 of the first substrate 2000 to remove the adhesive strength entirely, and the transfer head 4000 may employ a configuration in which the micro LEDs 100 are gripped selectively. Alternatively, the hot air supplying head 1000 may employ a configuration in which the adhesive strength holding the micro LEDs 100 is removed selectively, and the transfer head 4000 may employ a configuration in which the entire micro LEDs 100 are gripped.

Figure 13:
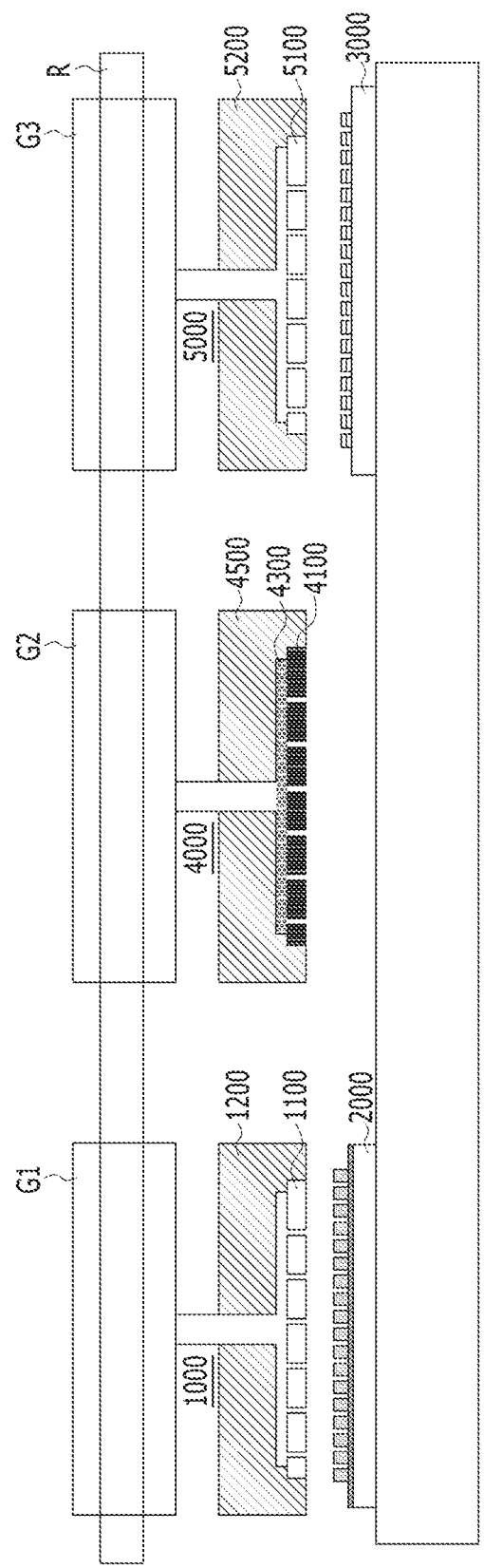
FIG. 13 is a view illustrating a transfer system according to a third embodiment of the present invention.

Micro LED Transfer System According to a Third Embodiment of the Present Invention FIG. 13 is a view illustrating a micro LED transfer system according to a third embodiment of the present invention.

The micro LED transfer system according to the third embodiment of the present invention differs from the micro LED transfer system according to the second embodiment in that a first hot air supplying head 1000, a transfer head 4000, and a second hot air supplying head 5000 are individually operated and perform their own functions.

The micro LED transfer system according to the third embodiment of the present invention includes: a first substrate 2000 provided with a first adhesive layer 2100; a second substrate 3000 provided with a second adhesive layer 3100; the first hot air supplying head 1000 blowing hot air toward upper surfaces of the micro LEDs 100 of the first substrate 2000 to remove adhesive strength of the first adhesive layer 2100; the transfer head 4000 transferring the micro LEDs 100 to the second substrate 3000 from the first substrate 2000; and the second hot air supplying head 5000 blowing hot air toward the upper surfaces of the micro LEDs 100 on the second substrate 3000 to impart adhesive strength to the second adhesive layer 3100 holding the micro LEDs 100.

The first hot air supplying head 1000 according to the third embodiment includes: a blowing unit 1100 blowing hot air; and a supporting unit 1200 supporting the blowing unit 1100. The first hot air supplying head 1000 may be embodied as the hot air supplying head 1000 according to the first embodiment and the modifications of the hot air supplying head 1000.

The second hot air supplying head 5000 according to the third embodiment includes: a blowing unit 5100 blowing hot air; and a supporting unit 5200 supporting the blowing unit 5100. The second hot air supplying head 5000 may be embodied as the hot air supplying head 1000 according to the first embodiment and the modifications of the hot air supplying head 1000.

The transfer head 4000 according to the third embodiment includes: a grip unit 4100 on which the micro LEDs 100 are gripped; a porous unit 4300 provided on the grip unit 4100; and a supporting unit 4500 providing a space for accommodating the grip unit 4100 and the porous unit 4300. The transfer head 4000 may be embodied as the transfer head 4000 according to the second embodiment.

The first hot air supplying head 1000 is provided in a first driving unit G1 movably installed along a rail R. The transfer head 4000 is provided in a second driving unit G2 movably installed along the rail R. The second hot air supplying head 5000 is provided in a third driving unit G3 movably installed along the rail R. Since the first to third driving units G1, G2, and G3 are installed on the rail R to be independently operated, the first hot air supplying head 1000, the transfer head 4000, and the second hot air supplying head 5000 are operated on the rail R individually.

The first hot air supplying head 1000 functions to detach the micro LEDs 100 from the first substrate 2000, the transfer head 4000 functions to transfer the detached micro LEDs 100 to the second substrate 3000 from the first substrate 2000, and the second hot air supplying head 5000 functions to bond the micro LEDs 100 to the second substrate 3000. Since the first hot air supplying head 1000, the transfer head 4000, and the second hot air supplying head 5000 are individually operated, the following simultaneously occur: the transfer head 4000 transfers the micro LEDs 100 to the second substrate 3000 and returns to the first substrate 2000, the first hot air supplying head 1000 detaches the micro LEDs 100 to be transferred from the first substrate 2000, and the second hot air supplying head 5000 bonds the transferred micro LEDs 100 to the second substrate 3000. Accordingly, transfer yield of the micro LEDs 100 per hour is improved.

Although the invention has been described with reference to certain specific embodiments, various modifications, additions, and substitutions thereof will be apparent to those skilled in the art without departing from the spirit and scope of the invention as outlined in the claims appended hereto.

What is claimed is:

1. A micro LED transfer system, comprising:
   a first substrate provided with a first adhesive layer;
   a second substrate provided with a second adhesive layer; and
   a hot air supplying head blowing hot air toward an upper surface of a micro LED on the first substrate,
   wherein the hot air supplying head removes adhesive strength of the first adhesive layer holding the micro LED and vacuum-sucks the micro LED released from the adhesive strength using a vacuum-suction force applied to a hole of the hot air supplying head to transfer the micro LED to the second substrate.

2. The system of claim 1, wherein the hot air supplying head blows hot air toward the micro LED to bond the micro LED to the second adhesive layer of the second substrate.

3. The system of claims 1, wherein the hot air supplying head blows hot air while being in contact with the upper surface of the micro LED.

4. The system of claims 1, wherein the hot air supplying head blows hot air while being spaced apart from the upper surface of the micro LED.

5. The system of claims 1, wherein at least one of the first substrate and the second substrate is provided with a heater.

* * * * *